United States Patent
Lyons et al.

(10) Patent No.: US 7,125,652 B2
(45) Date of Patent: Oct. 24, 2006

(54) IMMERSION LITHOGRAPHIC PROCESS USING A CONFORMING IMMERSION MEDIUM

(75) Inventors: Christopher F. Lyons, Fremont, CA (US); Carl P. Babcock, Campbell, CA (US); Jongwook Kye, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 424 days.

(21) Appl. No.: 10/726,413

(22) Filed: Dec. 3, 2003

(65) Prior Publication Data

US 2005/0122497 A1 Jun. 9, 2005

(51) Int. Cl.
*G03F 7/20* (2006.01)

(52) U.S. Cl. ...................... 430/311; 430/322

(58) Field of Classification Search ............... 430/311, 430/322
See application file for complete search history.

(56) References Cited

U.S. PATENT DOCUMENTS

| | | | |
|---|---|---|---|
| 4,509,852 A * | 4/1985 | Tabarelli et al. | 355/30 |
| 5,121,256 A | 6/1992 | Corle et al. | |
| 5,830,623 A | 11/1998 | Maruyama et al. | |
| 5,900,354 A | 5/1999 | Batchelder | |
| 2004/0224265 A1 * | 11/2004 | Endo et al. | 430/322 |

FOREIGN PATENT DOCUMENTS

| | | |
|---|---|---|
| EP | 1 494 075 | 1/2005 |
| WO | WO 02/41040 | 5/2002 |
| WO | WO 02/41040 A2 | 5/2002 |
| WO | WO 02/091078 | 11/2002 |

OTHER PUBLICATIONS

Tholl, "Evaluation of a Technique for the Design and Manufacture of an Off-Axis Holographic Lens in Dichromated Gelatin", J. Phys. D: Appl. Phys. 21 (1988), S99-S101.*
Franklin, "Refractive Index Matching: A General Method for Enhancing the Optical Clarity of a Hydrogel Matrix", Chem. Mater. 2002, 14, 4487-4489.*

* cited by examiner

*Primary Examiner*—Kathleen Duda
(74) *Attorney, Agent, or Firm*—Renner, Otto, Boisselle & Sklar, LLP

(57) ABSTRACT

A method of making a device using a lithographic system having a lens from which an exposure pattern is emitted. A conforming immersion medium can be positioned between a photo resist layer and the lens. The photo resist layer, which can be disposed over a wafer, and the lens can be brought into intimate contact with the conforming immersion medium. The photo resist can then be exposed with the exposure pattern so that the exposure pattern traverses the conforming immersion medium.

21 Claims, 1 Drawing Sheet

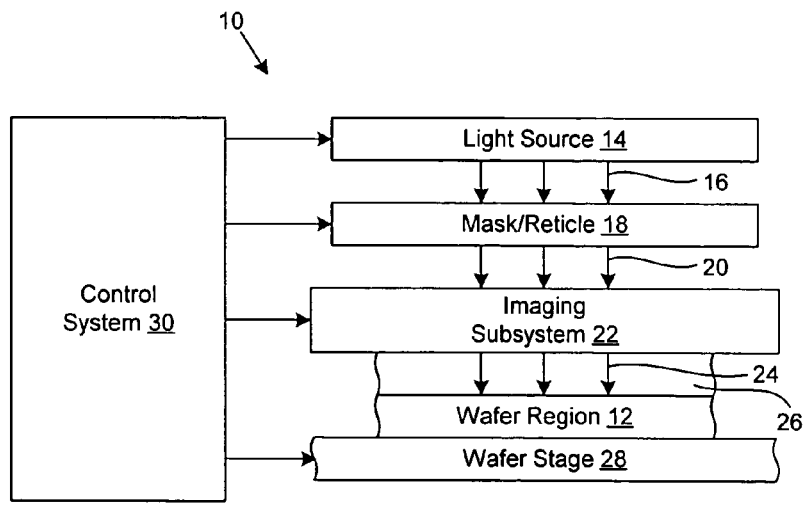
FIG. 1
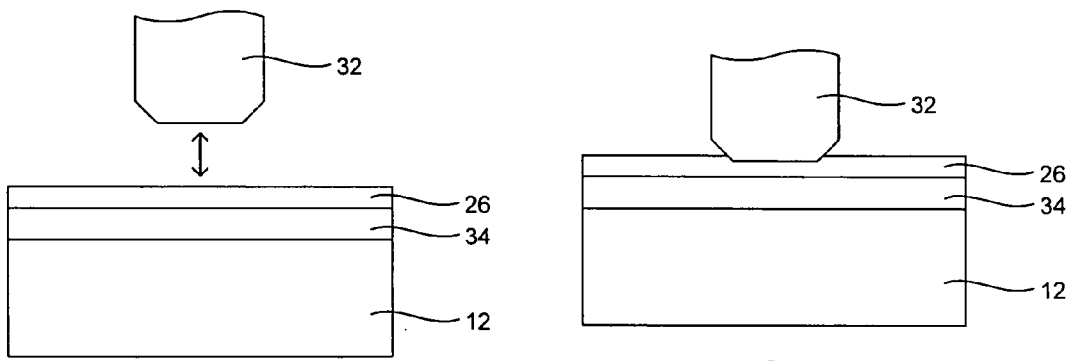
FIG. 2
FIG. 3
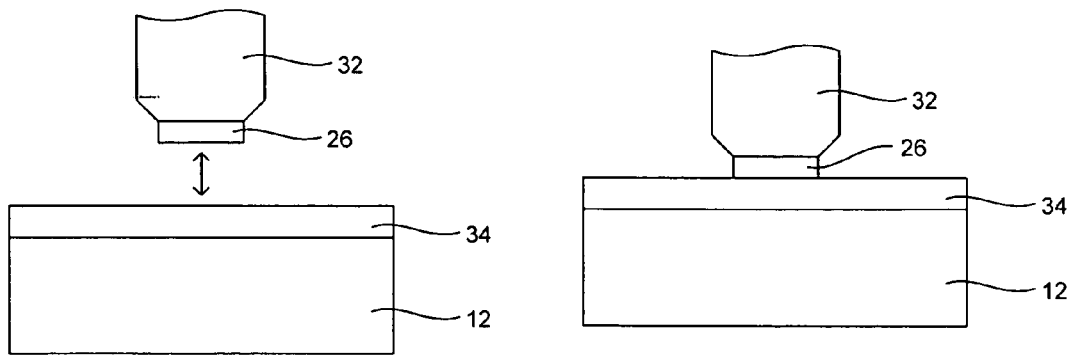
FIG. 4
FIG. 5

IMMERSION LITHOGRAPHIC PROCESS USING A CONFORMING IMMERSION MEDIUM

TECHNICAL FIELD

The present invention relates generally to the field of integrated circuit manufacture and, more particularly, to a method of immersion lithography using a conforming immersion medium, such as a medium having a solid, semi-solid, gel-like or rubbery consistency, and a corresponding apparatus.

BACKGROUND

The formation of various integrated circuit (IC) structures on a wafer often relies on lithographic processes, sometimes referred to as photolithography, or simply lithography. As is well known, lithographic processes can be used to transfer a pattern of a photomask (also referred to herein as a mask or a reticle) to a wafer.

For instance, patterns can be formed from a photo resist layer disposed on the wafer by passing light energy through a mask having an arrangement to image the desired pattern onto the photo resist layer. As a result, the pattern is transferred to the photo resist layer. In areas where the photo resist is sufficiently exposed and after a development cycle, the photo resist material can become soluble such that it can be removed to selectively expose an underlying layer (e.g., a semiconductor layer, a metal or metal containing layer, a dielectric layer, a hard mask layer, etc.). Portions of the photo resist layer not exposed to a threshold amount of light energy will not be removed and serve to protect the underlying layer during further processing of the wafer (e.g., etching exposed portions of the underlying layer, implanting ions into the wafer, etc.). Thereafter, the remaining portions of the photo resist layer can be removed.

There is a pervasive trend in the art of IC fabrication to increase the density with which various structures are arranged. As a result, there is a corresponding need to increase the resolution capability of lithography systems. One promising alternative to conventional "dry" lithography is a next-generation lithographic technique known as immersion lithography. In the immersion lithography systems proposed to date, the wafer to imaged by a lithography system is placed in a flowable liquid medium, through which the patterned light is transmitted. Known immersion lithography mediums are purified de-ionized water for use in conjunction with a 193 nm light source 14 (e.g., an argon fluorine (ArF) laser) and polyfluoroethers for use in conjunction with a 157 nm light source 14. These readily flowable immersion mediums replace an air or gas gap that is conventionally present between the final lens of a conventional dry lithography imaging system and the wafer.

However, attempts to implement immersion lithography have encountered a number of challenges. For example, minor variations and/or nonuniformities in the index of refraction of the immersion medium can adversely affect the quality of the exposure pattern incident on the wafer. The cause(s) of changes in the index of refraction of the liquid immersion medium can include, for example, flow of the immersion medium, changes in density of the immersion medium, changes in temperature of the immersion medium and so forth. In dry lithography, several joules of energy can be absorbed by the wafer from the exposure dose. In immersion lithography, it is believed that at least some of the energy from the exposure dose will be absorbed by the immersion medium. Also, since the immersion medium is in contact with at least the wafer, heat may be transferred from the wafer to immersion medium. The absorption of energy by the immersion medium, even in small quantities, may be sufficient to create a variation and/or nonuniformity in the index of refraction of the immersion medium that could adversely affect the imaging pattern. Also, the wafer may be mounted on a stage that is moved relative to the imaging subsystem. For example, the wafer may be exposed, then moved about 30 mm to a new location and stopped for a second exposure and so forth. Wafer motion rates can be about 250 mm/second to about 500 mm/second. This movement may create non-uniform fluid flow (e.g., turbulence, laminar flow, vortex flow, etc.) or other changes to the properties of the immersion medium that could result in variations in the index of refraction of the immersion medium. In addition, it is contemplated that the immersion medium may be purposefully placed in motion (e.g., in a flow pattern over the wafer) or subjected to hydraulic pressure. These factors may also invoke variations in the index of refraction of the immersion medium.

Bubbles and/or contaminants in a liquid immersion medium can also disrupt imaging of the wafer. Fluid flow of the immersion medium may cause bubbles to form and/or become submersed in the immersion medium. During exposure, gases may be released from the photo resist. These gases could dissolve in the immersion fluid, ultimately leading to bubble formation. It is also contemplated that a foreign body may be carried on the wafer and brought into the immersion medium where the foreign body dislodges from the wafer and begins to "float" in the immersion medium. Liquid immersion mediums are used repeatedly for multiple wafers and are subjected to repeated application of radiation that could lead to a significant build up of bubbles, dissolved matter and/or contaminants over time.

Accordingly, there exists a need in the art for improved immersion lithography processes and systems.

SUMMARY OF THE INVENTION

According to an aspect of the invention, the invention is directed to a method of making a device using a lithographic system having a lens from which an exposure pattern is emitted. The method can include providing a wafer and a photo resist layer disposed over the wafer; positioning a conforming immersion medium between the photo resist layer and the lens; moving at least one of the wafer and the lens such that the lens and the photo resist are in intimate contact with the conforming immersion medium; and exposing the photo resist with the exposure pattern, the exposure pattern traversing the conforming immersion medium.

According to another aspect of the invention, the invention is directed to a method of making a device using a lithographic system having a lens from which an exposure pattern is emitted. The method can include providing a wafer and a photo resist layer disposed over the wafer; bringing each of the lens and the photo resist layer into intimate contact with a conforming immersion medium, the conforming immersion medium disposed between the lens and the photo resist layer; and exposing the photo resist with the exposure pattern, the exposure pattern traversing the conforming immersion medium.

According to yet another aspect of the invention, the invention is directed to a lithographic system. The lithographic system can include a lens of a lithographic imaging assembly; a wafer having a photo resist layer disposed over the wafer; and a conforming immersion medium disposed between the lens and the photo resist layer and intimately contacting the photo resist layer and the lens.

BRIEF DESCRIPTION OF DRAWINGS

These and further features of the present invention will be apparent with reference to the following description and drawings, wherein:

FIG. 1 is a schematic block diagram of a exemplary integrated circuit processing arrangement;

FIGS. 2 and 3 schematically illustrate a first example embodiment of a conforming immersion lithography process; and FIGS. 4 and 5 schematically illustrate a second example embodiment of a conforming immersion lithography process.

DISCLOSURE OF INVENTION

In the detailed description that follows, similar components have been given the same reference numerals, regardless of whether they are shown in different views and/or embodiments. To illustrate the various aspects of the invention in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

The description herein is presented in the exemplary context of fabricating a wafer having an integrated circuit (IC) formed thereon. Example ICs include general purpose microprocessors made from thousands or millions of transistors, a flash memory array or any other dedicated circuitry. However, one skilled in the art will appreciate that the methods and devices described herein can also be applied to the fabrication of any article manufactured using lithography, such as micromachines, disk drive heads, gene chips, micro electro-mechanical systems (MEMS) and so forth.

The apparatus and methods described herein can provide for improved imaging of a wafer during a high resolution lithographic process. Namely, an exposure pattern can be directed toward the wafer through a highly controllable medium that has a desirable and uniform index of refraction so that distortion of the exposure pattern is minimized. The immersion medium is preferably a conforming immersion medium, such as a medium having a solid, semi-solid, gel-like or rubbery consistency.

As used herein, the term conforming immersion medium is used in its broadest sense and should not be limited by the example materials described herein. Conforming immersion mediums are materials that exhibit the physical properties described herein including the ability to maintain an unbroken state when disposed between a lens and a wafer, and, more particularly, between the lens and a photo resist layer disposed on top of the wafer. Conforming immersion mediums can maintain their unbroken state (e.g., the medium does not split apart as flowable liquids would) even in the presence of a deforming pressure applied on the medium by, for example, a lens of a lithography system. Conforming immersion mediums generally exhibit a resistance to being moved. Readily flowable liquids (e.g., convention liquid immersion mediums of water and polyfluoroethers) and gases have no elasticity and no resiliency when deformed, and, therefore, are not conforming immersion mediums.

At least three subclasses of conforming immersion mediums fall within the scope of conforming immersion mediums as used herein. These subclasses include hard materials, compliant materials and plastically deforming materials. Hard materials are materials that are solid, or not easily penetrated, cut or separated and do not yield easily to pressure. Typically, hard materials will break before being significantly deformed. Examples of hard materials include, for example, various glasses (e.g., quartz and fused silica), polycarbonate, polyacrylate, and so forth.

Compliant materials are those materials that readily yield to pressure without breaking. Compliant materials are pliant in that they can be supple, can bend easily and/or can deform easily. Compliant materials can have a resilient and/or elastic nature such that the material returns to a previous shape or position after undergoing pressure, stretching and/or other deforming force.

Plastically deforming materials are similar to compliant materials in that they will readily yield to pressure without breaking, can be supple, can bend easily and/or can deform easily. However, plastically deforming materials are generally not very resilient and/or elastic in nature. Rather, plastically deforming materials will tend to retain a new shape or position after undergoing pressure, stretching and/or other deforming force.

Referring to FIG. 1, illustrated is a schematic block diagram of an exemplary IC processing arrangement that includes a conforming immersion lithography system 10 used to image a pattern onto a wafer 12, or a region thereof. The system 10 can be, for example, a step-and-repeat exposure system or a step-and-scan exposure system, but is not limited to these example systems. The system 10 can include a radiation (e.g., light) source 14 for directing light energy 16 towards a photomask 18 (sometimes referred to as a mask or a reticle). The light energy 16 can have, for example, a deep ultraviolet wavelength (e.g., about 248 nm or about 193 nm), or a vacuum ultraviolet (VUV) wavelength (e.g., about 157 nm), although other wavelengths (e.g., an extreme ultraviolet wavelength) are possible and are considered to fall within the scope of the invention described and claimed herein.

The mask 18 selectively blocks light energy 16 such that a light energy pattern 20 defined by the mask 18 is transferred towards the wafer 12. An imaging subsystem 22, such as a stepper assembly or a scanner assembly, sequentially directs the energy pattern 20 transmitted by the mask 18 to a series of desired locations on the wafer 12. The imaging subsystem 20 may include a series of lenses and/or reflectors for use in scaling and directing the energy pattern 20 towards the wafer 12 in the form of an imaging (or exposure) light energy pattern 24.

The imaging pattern 24 (or exposure pattern) is transmitted by the imaging subsystem 22 through a conforming immersion medium 26 (also referred to herein simply as an immersion medium 26). The conforming immersion medium 26 has, in one embodiment, an index of refraction (n) of about 1.0 to about 1.5 at the exposure wavelength, but could be higher as described below. In one embodiment, the index of refraction of the conforming immersion medium is greater than 1.0, but is less than an index of refraction of a final lens 32 (FIGS. 2–5) of the imaging subsystem 22. In another embodiment, the index of refraction of the conforming immersion medium has a correspondence to the index of refraction of the final lens 32 of the imaging subsystem 22, such as being matched to or approximating the index of refraction of the final lens 32. In many conventional IC processing arrangements, the final lens of the imaging subsystem 22 can have an index of refraction of about 1.4 to about 1.7. Therefore, the index of refraction of the immersion medium 26 can be, in one embodiment, about 1.0 to about 1.7.

The conforming immersion medium 26 is preferably transmissive of the exposure wavelength, such as having a percent transmission of about 95% or higher at the exposure wavelength.

As will be discussed further below, the wafer 12 can be mounted to a wafer stage 28 that can be moved to position the wafer 12 relative to the imaging subsystem 22. A control system 30 can be used to control components and functions of the immersion lithography system 10, including, for example, positioning of the wafer 12 relative to the final lens 32 of the imaging subsystem 22. For example, the lens 32 can have an optical axis and the wafer 12 can be moved in a plane transverse to the optical axis and/or along the optical axis to vary a distance between the lens 32 and the wafer 12.

With additional reference to FIG. 2, shown is the wafer 12 having a photo resist layer 34 disposed thereon. Depending on the devices being made on the wafer 12 and how much processing the wafer has undergone, the wafer 12 can include multiple layers (e.g., a substrate, a dielectric layer(s), a polysilicon layer(s), an interdielectric layer(s), etc.) and/or structures formed up to a current process (e.g., doped wells, source/drain regions, gate stacks, spacers, contacts, etc.). The resist 34 can include, for example, radiation sensitive material as well as optional sublayers such as a primer, a bottom anti-reflective coating (BARC), an anti-reflective coating (ARC) and so forth.

In the embodiment of FIG. 2, disposed on or over the resist 34 is the conforming immersion medium 26. The conforming immersion medium 26 can be deposited as a layer. The conforming immersion medium 26 can be deposited so that when the lens 32 is brought into contact with the conforming immersion medium 26 for exposure of the resist 34, the conforming immersion medium 26 has a thickness greater than the coherence length of the illumination source. In one embodiment, the thickness is about one times to about twenty times the exposure wavelength and, in another embodiment, the thickness is about five times to about ten times the exposure wavelength. As will be discussed below, the conforming immersion medium 26 may be subjected to a compressive force as the lens 32 and wafer 12 are brought closer together for exposure of the resist 34.

The conforming immersion medium 26 can be made from any suitable material. Example classes of materials for the conforming immersion medium 26 include glasses, gelatins, silicone based materials, hydrogels, fluorinated materials, and mixtures of these materials (e.g., fluorinated silicone). Certain polymers and hydrocarbons may also be suitable. As should be appreciated, the identification of specific materials and/or classes of materials should not be considered limiting as any material exhibiting the properties described herein can serve as the conforming immersion medium 26.

Glasses generally include a silica based ceramic material that has an amorphous structure. Glasses are commonly considered to be an undercooled liquid of extremely high viscosity so as to have the appearance and properties of a solid. In many cases glasses have an almost 100 percent elastic recovery.

Gelatin generally are a mixture of proteins and can be strongly hydrophilic (e.g., absorbing up to ten times its weight of water). Gelatins can form reversible gels of relatively high strength and viscosity. A gel is a colloid in which a disperse phase has combined with a continuous phase to produce a viscous jelly-like product. For instance, about two percent gelatin in water can be used to form a stiff gel.

Silicone based materials are materials having a large group of siloxane polymers based on a structure consisting of alternate silicon and oxygen atoms with various organic radicals attached to the silicon. The silicone can optionally be cross-linked with a free radical initiator. Also, the silicone can be fluoronated. Suitable silicon based materials can include, for example, silicone acrylate, which can have an index of refraction of about 1.47, and fluoro-silicone acrylate, which can have an index of refraction of about 1.45. Hybrid organic/silicone formulations can also be used, such as bis-phenylpropyl dimethicone or phyenyl trimethicone.

A hydrogel is a polymeric material that exhibits an ability to swell in water and retain a significant fraction (e.g., greater than twenty percent) of water within its structure, but which does not dissolve in water. Hydrogels form and maintain an equilibrium state with water. Included in this definition are a wide variety of natural materials of both plant and animal origin, materials prepared by modifying naturally occurring structures and synthetic polymeric materials. Hydrogels are often used in the formation of contact lenses. In one embodiment, a suitable hydrogel is a cross-linked polyalkylene oxide. Commercially available water swellable polyethylene oxides for use in such a hydrogel include POLYOX WSR-205 from Union Carbide and ALKOK from Meisei Chemical Works. Another suitable hydrogel is a cross-linked polyacrylamide hydrogel, such as POLYFLOC AP 1142 from BetzDearborn, a division of Hercules, Inc. Additional discussion of hydrogels can be found in, for example, PCT Publication No WO 02/41040 A2, the contents of which are incorporated herein by reference in its entirety.

In addition to the conforming properties discussed thus far, the conforming immersion medium 26 can be compressible so as to deform when pressure is exerted on the immersion medium 26. The compressible nature of the material can be either elastic or plastic character. In one embodiment, the compressibility of the immersion medium 26 can assist in avoiding the presence of air or gas pockets or other voids at the interface between the immersion medium 26 and the wafer 12, at the interface between the immersion medium 26 and the lens 32 and within the immersion medium 26. Without intending to be bound by theory, it is believed that compressive force may urge bubbles and/or gas pockets out of the path of the exposure pattern 24 and/or into a dissolved state within the immersion medium 26. In this sense, the immersion medium 28 can be pliable to allow intimate contact with the wafer 12 and the lens 32.

In one embodiment, the immersion medium 26 can have fairly high surface energies or other cohesive force such that splitting of the immersion medium 26 is unlikely to occur and so that the immersion medium 26 is unlikely to fully transfer or to partially transfer (e.g., leave a residue) from wafer 12 to lens 32 or from lens 32 to wafer 12.

In a first example conforming immersion lithography process, the wafer 12 is prepared as shown in FIG. 2 (e.g., having the photo resist layer 34 formed on the wafer 12 and having the conforming immersion medium 26 formed on the photo resist layer 34). Using conventional alignment techniques, the wafer 12 with resist 34 and conforming immersion medium 26 can be aligned with respect to the optical axis of the lens 32 by movement of the wafer stage 28 (FIG. 1).

Thereafter, and with additional reference to FIG. 3, the lens 32 and the conforming immersion medium 26 can be brought into intimate contact with one another. For example, the wafer stage 28 can be moved closer to the lens 32 and/or the lens 32 can be moved closer to the wafer 12. Upon contact of the lens 32 and the conforming immersion medium 26 additional movement of the wafer stage 28 and/or lens 32 can be made to exert deforming pressure on the conforming immersion medium 26. As indicated and illustrated, this pressure may lead to some deformation of the conforming immersion medium 26.

Next, the photo resist 34 can be exposed to the exposure pattern 24 and, during such exposure, the exposure pattern 24 traverses the conforming immersion medium 26. As should be appreciated, only a portion of the photo resist 34, such as a portion corresponding to an individual die region of the wafer 12, may be exposed at a time. Therefore, after exposure with the exposure pattern 24, the conforming immersion medium 26 can be brought out of contact with the lens 32 (e.g., by movement of the wafer stage 28 and/or lens 32). The wafer 12, with photo resist 34 and conforming immersion medium 26, can be realigned with respect to the optical axis of the lens 32 and the conforming immersion medium 26 and lens 32 can once again be brought into contact with each other in the manner described above. This process can be repeated until each portion of the photo resist 34 to be exposed has been exposed.

With additional reference to FIGS. 4 and 5 a second example conforming immersion lithography process will be described. In the second example conforming immersion lithography process, the wafer 12 is prepared as shown in FIG. 4 (e.g., having the photo resist layer 34 formed on the wafer 12). In addition, the lens 32 is prepared by attaching, connecting or otherwise depositing the conforming immersion medium 26 onto the lens 32. Depending on the orientation of the lens 32, the conforming immersion medium 26 may remain in place by gravity, adhesion, static charge, adhesive properties (e.g., placing an optical adhesive between the lens 32 and the conforming immersion medium 26), or any other suitable technique.

Thereafter, the wafer 12, with resist 34, can be aligned with respect to the optical axis of the lens 32 using convention alignment techniques (e.g., by movement of the wafer stage 28). The conforming immersion medium 26 and photo resist layer 34 can be brought into intimate contact with one another. For example, the wafer stage 28 can be moved closer to the lens 32 and/or the lens 32 can be moved closer to the wafer 12. Upon contact of the conforming immersion medium 26 and the photo resist layer 34, additional movement of the wafer stage 28 and/or lens 32 can be made to exert deforming pressure on the conforming immersion medium 26. As indicated, this pressure may lead to some deformation of the conforming immersion medium 26.

Next, the photo resist 34 can be exposed to the exposure pattern 24 and, during such exposure, the exposure pattern 24 traverses the conforming immersion medium 26. As should be appreciated, only a portion of the photo resist 34, such as a portion corresponding to an individual die region of the wafer 12, may be exposed at a time. Therefore, after exposure with the exposure pattern 24, the conforming immersion medium 26 can be brought out of contact with the photo resist 34 (e.g., by movement of the wafer stage 28 and/or lens 32). The wafer 12 with photo resist 34 can be realigned with respect to the optical axis of the lens 32 and the conforming immersion medium 26 and photo resist layer 34 can once again be brought into contact with each other in the manner described above. This process can be repeated until each portion of the photo resist 34 to be exposed has been exposed.

As should be appreciated, various modifications can be made to the foregoing lithographic techniques without departing from the scope of the invention as defined by the claims appended hereto. For example, realignment of the wafer 12 with respect to the optical axis of the lens 32 can be made without bringing the lens 12 and conforming immersion medium 26 or the conforming immersion medium 26 and photo resist layer 34 out of engagement with one another.

The conforming immersion medium 26 can provide a higher index of refraction for the medium through which the exposure pattern traverses than is conventionally available in dry lithographic processes and flowable liquid immersion lithographic processes. It is believed that the closer the index of refraction for the immersion medium is to the index of refraction of the lens 32, the better the resolution of the exposure incident on the photo resist 34.

Also, non-flowable immersion medium mediums, such as the conforming immersion medium 26 described herein, can be more controllable than flowable immersion mediums. For example, the index of refraction throughout the volume of immersion medium through which the exposure pattern 24 traverses can be more uniform than with flowable immersion mediums. Also, the likelihood of bubble formation in the conformable immersion medium 26 is lower than for flowable liquid immersion mediums. It is noted that bubbles that are small with respect to the exposure wavelength (e.g., tens or hundreds of times smaller) can be tolerated as such small bubbles would have a an insignificant impact on image formation. In flowable liquid immersion lithography, repeated exposure of the same immersion medium can lead to the formation bubbles with sizes that are relatively large with respect to the exposure wavelength.

In sum, the use of a conforming immersion medium rather than a flowable immersion medium avoids the introduction of the fluid properties of the flowable immersion medium in the immersion lithographic process, thereby allowing for low distortion imaging. Also, benefits associated with immersion lithographic can be realized, including, for example, effective wavelength reduction and effective numerical aperture increase.

In one embodiment, the conforming immersion medium 26 is disposable. For example, the conforming immersion medium 26 is used for the exposures associated with one particular mask 18 and wafer 12. Then, the conforming immersion medium 26 is either removed from the wafer 12 for further processing of the wafer 12 (e.g., photo resist 34 development and/or processing of a wafer layer underlying the photo resist 34) or removed from the lens 32 and replaced with a new conforming immersion medium 26. In the case where the conforming immersion medium 26 is first deposited on or over the photo resist layer 34, it is possible that each portion of the conforming immersion medium 26 will be exposed to the exposure pattern 24 only once. In the case where the conforming immersion medium 26 first engages the lens 32, the conforming immersion medium 26 may be exposed to the exposure pattern 24 multiple times, but not with enough repetition to lead to bubble formation or non-uniformities in refractive index. Therefore, in some cases, the exposures associated with multiple masks and/or wafers may be made with the same conforming immersion medium 26 mounted upon the lens 32. In one embodiment, conforming immersion medium material removed from the wafer 12 or lens 32 can be recovered, purified and/or reused by way of a recycling process.

Since the conforming immersion medium 26 is used only for a limited number of exposures and radiation exposure is correspondingly limited, it is believed that bubble formation that would affect image formation and/or the introduction of contaminants into the immersion medium can be minimized. As a result, a high resolution and quality image can be imaged onto the photo resist layer 34.

In one embodiment, prior to exposure with the exposure pattern 24, the conforming immersion medium 26 can be scanned to determine if the conforming immersion medium 26 is in an acceptable condition. For instance, the conforming immersion medium 26 can be scanned for conforming immersion medium 26 refractive index uniformity using, for example, an interferometric technique as described in greater detail in co-pending U.S. patent application Ser. No. 10/628,021, filed Jul. 25, 2003, the disclosure of which is incorporated herein by reference in its entirety. The conforming immersion medium 26 also can be scanned for the presence of a foreign body (e.g., particulate matter or bubbles) using, for example, a scattered light detector assembly to detect light emitted by a test laser and scatted by the foreign body as described in greater detail in co-pending U.S. patent application Ser. No. 10/638,927, filed Aug. 11, 2003, the disclosure of which is incorporated herein by reference in its entirety.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of making a device using a lithographic system having a lens from which an exposure pattern is emitted, comprising:
   providing a wafer and a photo resist layer disposed over the wafer;
   positioning a conforming immersion medium between the photo resist layer and the lens;
   moving at least one of the wafer and the lens such that the lens and the photo resist are in intimate contact with the conforming immersion medium; and
   exposing the photo resist with the exposure pattern, the exposure pattern traversing the conforming immersion medium.

2. The method of claim 1, wherein the device is an integrated circuit.

3. The method of claim 1, wherein positioning the conforming immersion medium includes coating the photo resist with the conforming immersion medium.

4. The method of claim 3, wherein the moving brings the lens into contact with an upper surface of the conforming immersion medium.

5. The method of claim 4, wherein deforming pressure is exerted on the conforming immersion medium by the lens.

6. The method of claim 4, further comprising:
   repositioning the wafer, photo resist and conforming immersion medium with respect to the lens by bringing the lens out of contact with the upper surface of the conforming immersion medium, moving the wafer and bringing the lens into contact with the upper surface of the conforming immersion medium; and
   exposing the repositioned photo resist with the exposure pattern, the exposure pattern traversing the conforming immersion medium.

7. The method of claim 1, wherein positioning the conforming immersion medium includes coating the lens with the conforming immersion medium.

8. The method of claim 7, wherein the moving brings the photo resist into contact with a lower surface of the conforming immersion medium.

9. The method of claim 8, wherein deforming pressure is exerted on the conforming immersion medium with the lens.

10. The method of claim 8, further comprising:
    repositioning the wafer and photo resist with respect to the lens and the conforming immersion medium by bringing the photo resist out of contact with the lower surface of the conforming immersion medium, moving the wafer and bringing the lower surface of the conforming immersion medium into contact with the photo resist; and
    exposing the repositioned photo resist with the exposure pattern, the exposure pattern traversing the conforming immersion medium.

11. The method of claim 7, wherein the conforming immersion medium is discarded after a predetermine number of exposures are made through the conforming immersion medium.

12. The method of claim 1, wherein an index of refraction of the conforming immersion medium is about 1.0 to about 1.5.

13. The method of claim 1, wherein the conforming immersion medium has an index of refraction selected to correspond to an index of refraction of the lens.

14. The method of claim 1, wherein the conforming immersion medium is made from a hydrogel.

15. The method of claim 1, wherein the conforming immersion medium is made from a glass.

16. The method of claim 1, wherein the conforming immersion medium is made from a gelatin.

17. The method of claim 1, wherein the conforming immersion medium is made from a silicone based material.

18. The method of claim 17, wherein the conforming immersion medium is fluoronated.

19. The method of claim 1, further comprising repositioning the wafer with respect to the lens and re-exposing the photo resist with the exposure pattern.

20. The method of claim 1, wherein, after moving, the conforming immersion medium has a thickness of about five times to about ten times an exposure wavelength of the exposure patter.

21. A method of making a device using a lithographic system having a lens from which an exposure pattern is emitted, comprising:
    providing a wafer and a photo resist layer disposed over the wafer;
    bringing each of the lens and the photo resist layer into intimate contact with a conforming immersion medium, the conforming immersion medium disposed between the lens and the photo resist layer; and
    exposing the photo resist with the exposure pattern, the exposure pattern traversing the conforming immersion medium.

* * * * *

UNITED STATES PATENT AND TRADEMARK OFFICE
CERTIFICATE OF CORRECTION

PATENT NO. : 7,125,652 B2  Page 1 of 1
APPLICATION NO. : 10/726413
DATED : October 24, 2006
INVENTOR(S) : Lyons et al.

It is certified that error appears in the above-identified patent and that said Letters Patent is hereby corrected as shown below:

Claim 20, line 4 (column 10, line 49), please replace "exposure patter." with --exposure pattern.--.

Signed and Sealed this

Sixteenth Day of January, 2007

JON W. DUDAS
*Director of the United States Patent and Trademark Office*